(12) United States Patent
Zhu et al.

(10) Patent No.: US 12,088,092 B2
(45) Date of Patent: Sep. 10, 2024

(54) ELECTROSTATIC DISCHARGE PROTECTION CIRCUIT FOR CHIP

(71) Applicant: CHANGXIN MEMORY TECHNOLOGIES, INC., Hefei (CN)

(72) Inventors: Ling Zhu, Hefei (CN); Kai Tian, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 210 days.

(21) Appl. No.: 17/810,900

(22) Filed: Jul. 6, 2022

(65) Prior Publication Data

US 2023/0023642 A1   Jan. 26, 2023

Related U.S. Application Data

(63) Continuation of application No. PCT/CN2022/088843, filed on Apr. 24, 2022.

(30) Foreign Application Priority Data

Jul. 26, 2021  (CN) .......................... 202110844712.1

(51) Int. Cl.
*H02H 9/04* (2006.01)
*H01L 27/02* (2006.01)

(52) U.S. Cl.
CPC ......... *H02H 9/046* (2013.01); *H01L 27/0266* (2013.01)

(58) Field of Classification Search
CPC ............................ H02H 9/046; H01L 27/0266

USPC ............................................................ 361/56

See application file for complete search history.

(56) References Cited

U.S. PATENT DOCUMENTS

| 5,719,737 A | 2/1998 | Maloney | |
| 8,643,988 B1* | 2/2014 | Kwong | H02H 9/046 361/118 |
| 9,013,845 B1* | 4/2015 | Karp | H02H 9/041 361/91.1 |
| 2003/0043523 A1* | 3/2003 | Hung | H02H 9/046 361/111 |
| 2006/0072267 A1 | 4/2006 | Chatty et al. | |

(Continued)

FOREIGN PATENT DOCUMENTS

| CN | 103001206 A | * | 3/2013 | ............. H02H 9/046 |
| CN | 112420688 A | * | 2/2021 | ......... H01L 27/0266 |

*Primary Examiner* — Dharti H Patel

(74) *Attorney, Agent, or Firm* — Kilpatrick Townsend & Stockton LLP

(57) ABSTRACT

The present disclosure provides an electrostatic discharge (ESD) protection circuit for a chip, including: a monitoring unit, configured to generate a trigger signal when there is an ESD pulse on a power supply pad; a discharge transistor, located between the power supply pad and a ground pad, and configured to be turned on under a control of the trigger signal, so as to discharge an electrostatic charge to the ground pad; and a first controllable voltage division unit, connected to the discharge transistor, and configured to switch an operating mode under a control of a control signal. The operating mode includes a voltage division mode. When operating in the voltage division mode, the controllable voltage division unit is configured to carry a part of a voltage applied by the electrostatic charge to the discharge transistor.

14 Claims, 10 Drawing Sheets

(56) References Cited

U.S. PATENT DOCUMENTS

2007/0127173 A1* 6/2007 Chang ................ H01L 27/0266
  361/56
2023/0170689 A1* 6/2023 Zhu .................... H01L 27/0266
  361/56

* cited by examiner

ELECTROSTATIC DISCHARGE PROTECTION CIRCUIT FOR CHIP

CROSS-REFERENCE TO RELATED APPLICATIONS

This is a continuation of International Application No. PCT/CN2022/088843, filed on Apr. 24, 2022, which claims the priority to Chinese Patent Application No. 202110844712.1, titled "ELECTROSTATIC DISCHARGE PROTECTION CIRCUIT FOR CHIP" and filed with China National Intellectual Property Administration (CNIPA) on Jul. 26, 2021. The entire contents of International Application No. PCT/CN2022/088843 and Chinese Patent Application No. 202110844712.1 are incorporated herein by reference.

TECHNICAL FIELD

The present disclosure relates to the technical field of integrated circuits, and in particular, to an electrostatic discharge (ESD) protection circuit for a chip.

BACKGROUND

Static electricity is everywhere. Without an ESD protection circuit, a chip will soon be damaged, and almost fatally damaged, by static electricity introduced due to various reasons.

Therefore, a chip is usually provided with an ESD protection circuit, which is used to discharge electrostatic charges in a timely manner, to prevent a protected circuit from failing or even burning due to a high voltage caused by the electrostatic charges.

SUMMARY

One embodiment of the present disclosure provides an electrostatic discharge protection circuit for a chip. The chip includes a power supply pad and a ground pad. The electrostatic discharge protection circuit includes:
  a monitoring unit, configured to generate a trigger signal when there is an electrostatic discharge pulse on the power supply pad;
  a discharge transistor, located between the power supply pad and the ground pad, and configured to be turned on under a control of the trigger signal, so as to discharge an electrostatic charge to the ground pad; and
  a first controllable voltage division unit, connected to the discharge transistor, and configured to switch an operating mode under a control of a control signal, wherein the operating mode includes a voltage division mode, and when operating in the voltage division mode, the first controllable voltage division unit is configured to carry a part of a voltage applied by the electrostatic charge to the discharge transistor.

BRIEF DESCRIPTION OF THE DRAWINGS

The accompanying drawings incorporated into the specification and constituting part of the specification illustrate the embodiments of the present disclosure, and serve, together with the specification, to explain the principles of the present disclosure.

Specific embodiments of the present application are shown by using the accompanying drawings and are described below in more detail. The accompanying drawings and text description are not intended to limit the scope of the concept of the present application in any manner, but to explain the concept of the present application for those skilled in the art with reference to specific embodiments.

DETAILED DESCRIPTION

Exemplary embodiments are described in detail herein, and examples thereof are represented in the accompanying drawings. When the following descriptions relate to the accompanying drawings, unless otherwise stated, same numerals in different accompanying drawings represent same or similar elements. Implementations described in the following exemplary embodiments do not represent all implementations consistent with the present disclosure. On the contrary, the implementations are merely examples of apparatuses and methods that are described in detail in the appended claims and consistent with some aspects of the present disclosure.

Those skilled in the art may easily figure out other implementation solutions of the present disclosure after considering the specification and practicing the invention disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

The present disclosure discloses an ESD protection circuit for a chip. The technical concept of the present disclosure is as follows: a plurality of controllable voltage division units are provided in the ESD protection circuit, a plurality of chips are produced through one tape-out, and operating modes of the controllable voltage division units in the chips are set according to electrostatic voltage grades used in the chips are set, such that ESD protection circuits adapted to different electrostatic voltage grades can be produced through one tape-out, and the chip production cost is reduced.

Figure 1:
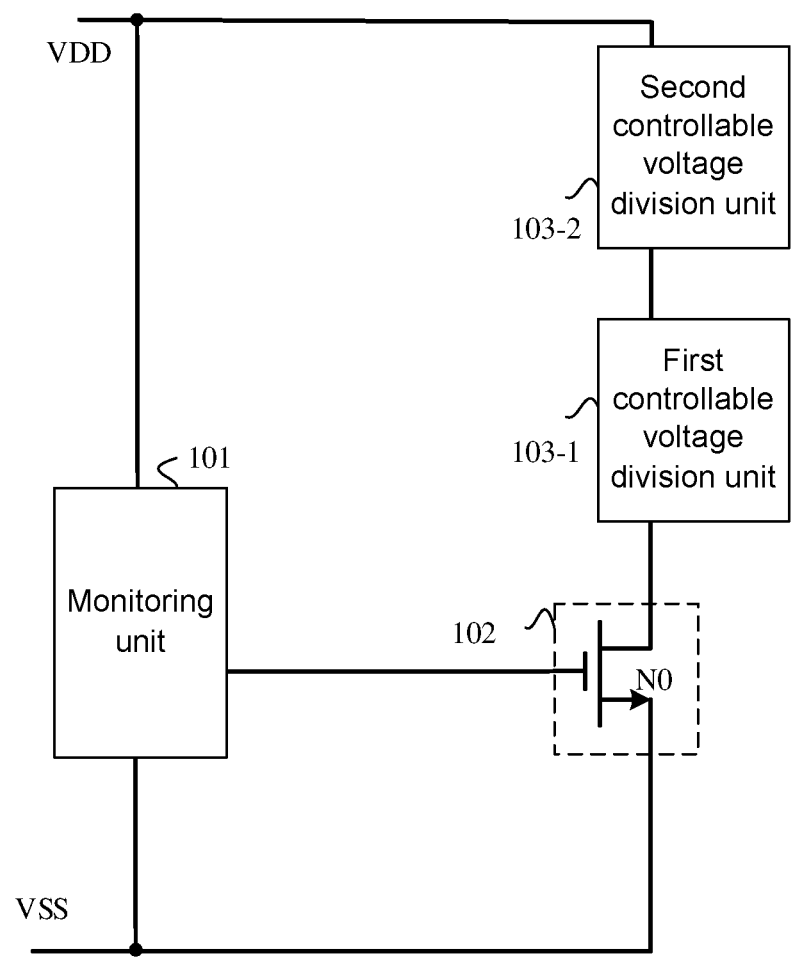
FIG. 1 is a structural block diagram of an ESD protection circuit for a chip according to one embodiment of the present disclosure.

As shown in FIG. 1, one embodiment of the present disclosure provides an ESD protection circuit for a chip. The chip includes a power supply pad VDD and a ground pad VSS. The ESD protection circuit includes a monitoring unit 101, a discharge transistor 102, and a first controllable voltage division unit 103-1.

The monitoring unit 101 is connected to a control terminal of the discharge transistor 102, and the discharge transistor 102 is connected to the first controllable voltage division unit 103-1 and then located between the power supply pad VDD and the ground pad VSS.

The monitoring unit 101 is configured to monitor an electrostatic charge on the power supply pad VDD and generate a trigger signal when there is an electrostatic charge on the power supply pad VDD. The discharge transistor 102 is configured to be turned on under the control of the trigger signal so as to discharge the electrostatic charge on the power supply pad VDD to the ground pad VSS.

The first controllable voltage division unit 103-1 includes a voltage division mode and a bypass mode. When operating in the voltage division mode, the first controllable voltage division unit 103-1 is configured to carry a part of a voltage applied by the electrostatic charge to the discharge transistor 102. When operating in the bypass mode, the first controllable voltage division unit 103-1 cannot carry a part of the voltage applied by the electrostatic charge to the discharge transistor 102.

A control signal is configured to switch an operating mode of the first controllable voltage division unit 103-1. That is, the control signal can be configured to switch the first controllable voltage division unit 103-1 from the voltage division mode to the bypass mode, or from the bypass mode to the voltage division mode.

In one embodiment, the ESD protection circuit further includes a second controllable voltage division unit 103-2. The second controllable voltage division unit 103-2 is connected to the first controllable voltage division unit 103-1 and configured to switch an operating mode under the control of the control signal. The operating mode of the second controllable voltage division unit 103-2 includes a voltage division mode and a bypass mode. That is, the control signal can be configured to switch the second controllable voltage division unit 103-2 from the voltage division mode to the bypass mode, or from the bypass mode to the voltage division mode.

By switching the operating modes of the first controllable voltage division unit 103-1 and the second controllable voltage division unit 103-2 through the control signal, the number of controllable voltage division units in the voltage division mode in the ESD protection circuit can be set, such that the voltage applied by the electrostatic charge to the discharge transistor 102 can be controlled.

For example, by configuring the first controllable voltage division unit 103-1 and the second controllable voltage division unit 103-2 to be in the voltage division mode, more voltage applied to the discharge transistor 102 can be divided, such that breakdown of the discharge transistor 102 can be prevented, that is, the electrostatic voltage grade of the ESD protection circuit is higher.

A plurality of chips are produced through one tape-out, and the number of controllable voltage division units in the voltage division mode in the ESD protection circuit is set through the control signal, such that ESD protection circuits adapted to different voltage grades can be obtained, and the chip production cost is reduced.

In one embodiment, the ESD protection circuit may further include a third controllable voltage division unit, a fourth controllable voltage division unit, . . . , and an N-th controllable voltage division unit. The plurality of controllable voltage division units are connected to a drain of the discharge transistor 102 after successive connection and then are connected between the power supply pad VDD and the ground pad VSS, and the number of controllable voltage division units in the voltage division mode in the ESD protection circuit is set through the control signal, such that the range of adapted voltage grades is broader.

The following description is based on the fact that the ESD protection circuit includes only two controllable voltage division units, and the case where the ESD protection circuit includes multiple controllable voltage division units is similar. Therefore, details are not described herein again.

In one embodiment, still referring to FIG. 1, each of the first controllable voltage division unit 103-1 and the second controllable voltage division unit 103-2 is provided with a first terminal and a second terminal. When the discharge transistor 102 is an N-type transistor, a source of the discharge transistor 102 is connected to the ground pad VSS, a drain of the discharge transistor 102 is connected to a second terminal of the first controllable voltage division unit 103-1, a first terminal of the first controllable voltage division unit 103-1 is connected to a second terminal of the second controllable voltage division unit 103-2, and a first terminal of the second controllable voltage division unit 103-2 is connected to the power supply pad VDD. That is, the first controllable voltage division unit 103-1 and the second controllable voltage division unit 103-2 adjust the voltage applied to the discharge transistor 102 between the drain of the discharge transistor 102 and the power supply pad VDD.

Figure 2:
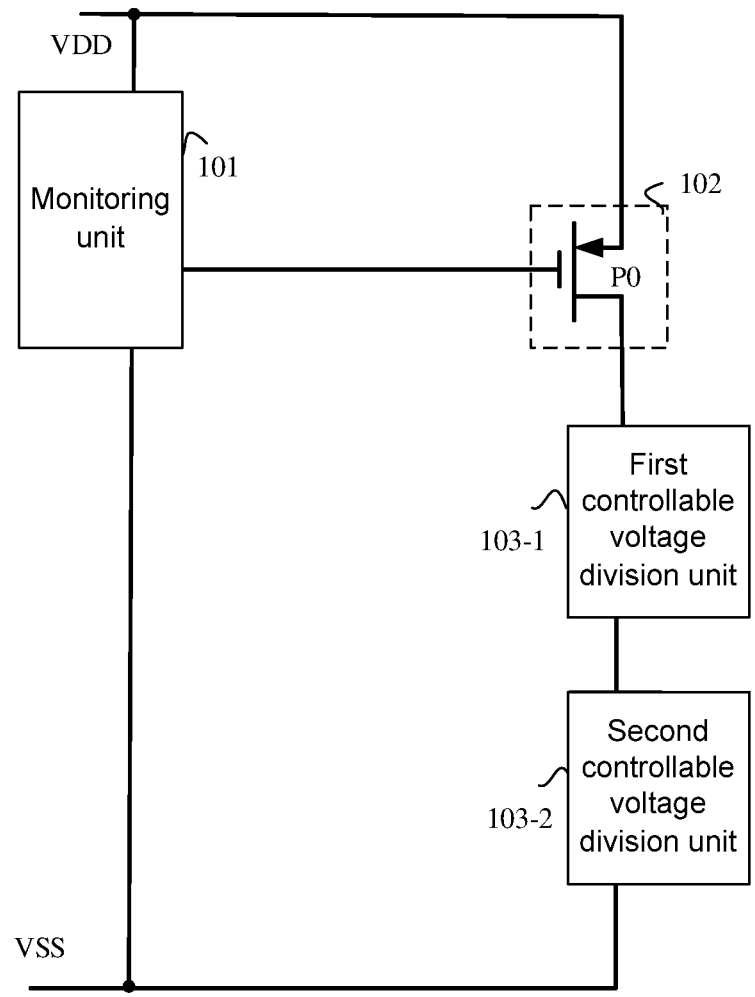
FIG. 2 is a specific circuit diagram of an ESD protection circuit for a chip according to another embodiment of the present disclosure.

In one embodiment, referring to FIG. 2, when the discharge transistor 102 is a P-type transistor, a source of the discharge transistor 102 is connected to the power supply pad VDD, a drain of the discharge transistor 102 is connected to a first terminal of the first controllable voltage division unit 103-1, a second terminal of the first controllable voltage division unit 103-1 is connected to a first terminal of the second controllable voltage division unit 103-2, and a second terminal of the second controllable voltage division unit 103-2 is connected to the ground pad VSS. That is, the first controllable voltage division unit 103-1 and the second controllable voltage division unit 103-2 adjust the voltage applied to the discharge transistor 102 between the drain of the discharge transistor 102 and the ground pad VSS.

In one embodiment, the first controllable voltage division unit 103-1 includes at least one voltage division element and a control circuit. The voltage division element is provided with a first terminal and a second terminal. After successive connection, a first terminal of a voltage division element at a head end is the first terminal of the first controllable voltage division unit 103-1, and a second terminal of a voltage division element at a tail end is the second terminal of the first controllable voltage division unit 103-1.

For example, the first controllable voltage division unit 103-1 includes three voltage division elements, marked as a first voltage division element, a second voltage division element, and a third voltage division element. A second terminal of the first voltage division element is connected to a first terminal of the second voltage division element, a second terminal of the second voltage division element is connected to a first terminal of the third voltage division element, the first terminal of the first voltage division element at the head end is the first terminal of the first controllable voltage division unit 103-1, and the second terminal of the third voltage division element at the tail end is the second terminal of the first controllable voltage division unit 103-1.

The control circuit is connected to the first terminal of the voltage division element at the head end, also connected to the second terminal of the voltage division element at the tail end, and configured to switch the at least one voltage division element from the voltage division mode to the bypass mode or from the bypass mode to the voltage division mode under the control of the control signal.

The control circuit is connected in parallel with the at least one voltage division element connected successively. After the control circuit receives the control signal, if the control circuit is switched to a turn-on state, the at least one voltage division element connected successively is bypassed, thereby switching the voltage division element connected successively from the voltage division mode to the bypass mode. After the control circuit receives the control signal, if the control circuit is switched to a turn-off state, the at least one voltage division element connected successively can allow an electrostatic current to pass through, thereby switching the voltage division element connected successively from the bypass mode to the voltage division mode.

In the foregoing technical solution, the ESD protection circuit includes at least one controllable voltage division unit. After a plurality of chips are produced through one tape-out, the number of controllable voltage division units in the voltage division mode in the ESD protection circuit can be set, thereby obtaining ESD protection circuits adapted to different electrostatic voltage grades, and reducing the chip production cost.

As shown in FIG. 3 to FIG. 6, one embodiment of the present disclosure provides an ESD protection circuit for a chip. The ESD protection circuit includes a monitoring unit 101, a discharge transistor 102, a first controllable voltage division unit 103-1, and a second controllable voltage division unit 103-2.

Each of the first controllable voltage division unit 103-1 and the second controllable voltage division unit 103-2 is provided with a first terminal and a second terminal, and the first controllable voltage division unit 103-1 and the second controllable voltage division unit 103-2 are connected in series and then connected to a drain of the discharge transistor 102.

The structure of the first controllable voltage division unit 103-1 is the same as the structure of the second controllable voltage division unit 103-2, and the first controllable voltage division unit 103-1 is described herein as an example.

The first controllable voltage division unit 103-1 includes at least one voltage division element and a control circuit. At least one voltage division unit is connected successively and then connected in parallel to the control circuit.

Figure 3:
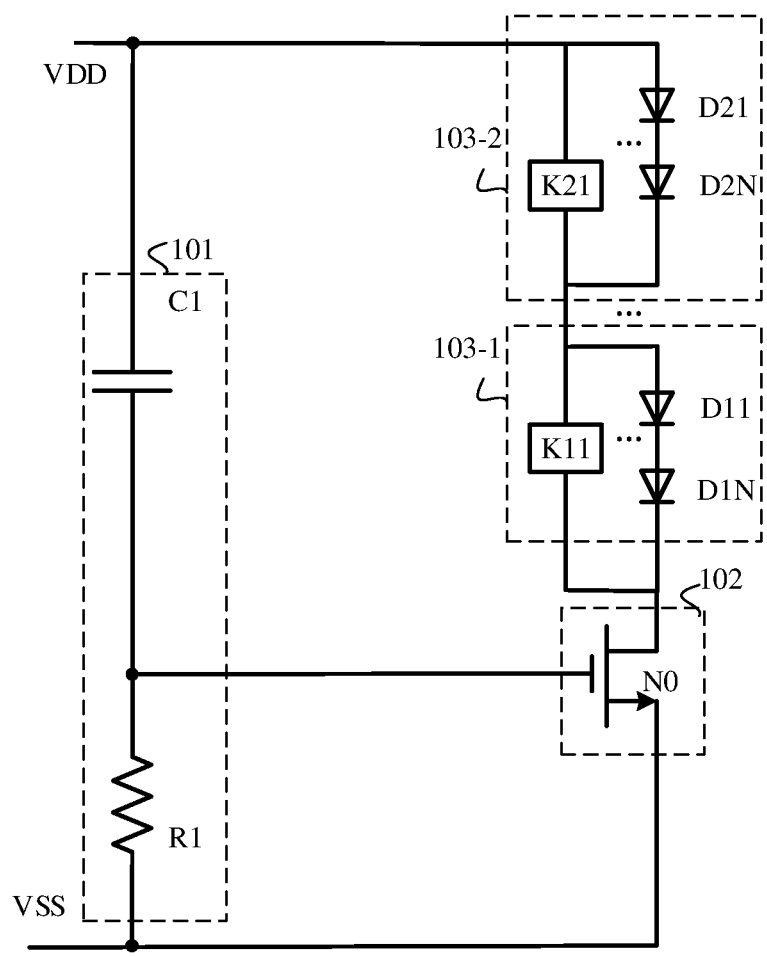
FIG. 3 is a specific circuit diagram of an ESD protection circuit for a chip according to another embodiment of the present disclosure.
Figure 4:
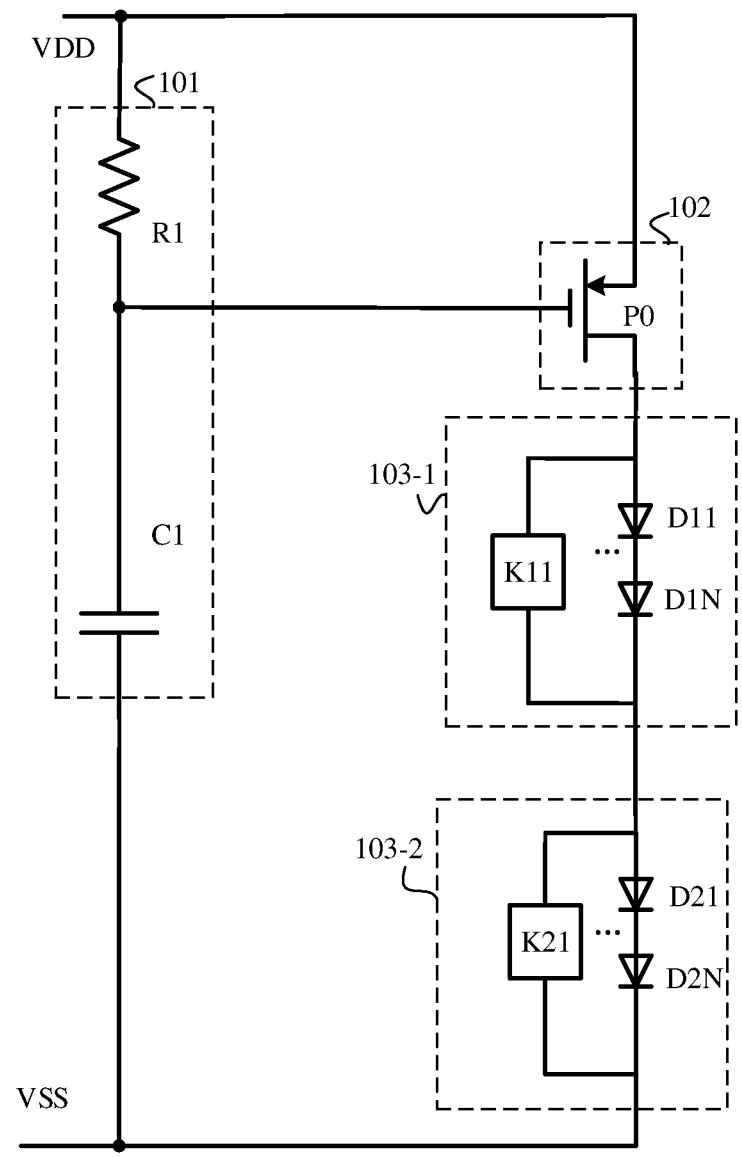
FIG. 4 is a specific circuit diagram of an ESD protection circuit for a chip according to another embodiment of the present disclosure.

In one embodiment, referring to FIG. 3 and FIG. 4, the control circuit includes a first switch K11. The first switch K11 is provided with a first terminal connected to the first terminal of the voltage division element at the head end, and a second terminal connected to the second terminal of the voltage division element at the tail end.

The control signal can be configured to switch the state of the first switch K11. When the control signal is configured to switch the state of the first switch K11 to an on state, the first switch K11 makes the voltage division elements connected successively in the bypass state, and the electrostatic current flows through the first switch K11. When the control signal is configured to switch the state of the first switch K11 to an off state, the electrostatic current flows through the voltage division elements connected successively, and the voltage division elements connected successively in the first controllable voltage division unit 103-1 can perform voltage division on the voltage caused by the electrostatic charge with the discharge transistor 102.

In one embodiment, each voltage division element is a diode, provided with an anode being the first terminal of the voltage division element and a cathode being the second terminal of the voltage division element. After successive connection of a diode D11 to a diode DIN, an anode of the diode D11 at the head end is the first terminal of the first controllable voltage division unit 103-1, and the diode DIN at the tail end is the second terminal of the first controllable voltage division unit 103-1. Each diode may be formed of a PN junction, or may be formed by short-circuiting a gate and a drain of an MOS transistor. The specific structure of each diode is not limited in the present disclosure.

Since each diode has a certain clamp voltage, for example, the clamp voltage is 0.7 V, the voltage of the drain of the discharge transistor 102 is VDD−0.7*N, where N is the number of diodes, and a specific numeric value of N is determined according to a breakdown voltage drop that the discharge transistor can withstand and a voltage VDD caused by accumulation of the electrostatic charge.

In one embodiment, the first switch K11 includes a one-time programmable memory. The one-time programmable memory may be a laser fuse device.

When the first switch K11 is in the non-fusing state, the first controllable voltage division unit 103-1 is in the bypass mode, and when fuse processing is performed on the first switch K11, the first switch K11 is in the fusing state, and the first controllable voltage division unit 103-1 is in the voltage division mode.

A plurality of chips are produced through one tape-out, the fuse processing is performed on the laser fuse device in the ESD protection circuit, the number of controllable voltage division units in the voltage division mode in the ESD protection circuit can be set, and the grade of the electrostatic charge that the ESD protection circuit can withstand is set.

With referring to FIG. 3, when the discharge transistor 102 is an N-type transistor, the source of the discharge transistor 102 is connected to the ground pad VSS, the drain of the discharge transistor 102 is connected to the second terminal of the first controllable voltage division unit 103-1, the first terminal of the first controllable voltage division unit 103-1 is connected to the second terminal of the second controllable voltage division unit 103-2, and the first terminal of the second controllable voltage division unit 103-2 is connected to the power supply pad VDD.

The monitoring unit 101 includes a monitoring capacitor C1 and a monitoring resistor R1, each provided with a first terminal and a second terminal. The monitoring capacitor C1 is provided with the first terminal connected to the power supply pad VDD, and the second terminal successively connected to the first terminal of the monitoring resistor R1 and the control terminal of the discharge transistor 102. The second terminal of the monitoring resistor R1 is connected to the ground pad VSS.

When there is an electrostatic charge on the power supply pad VDD, an equivalent resistance of the monitoring capacitor C1 decreases, the control terminal of the discharge transistor 102 is pulled up to a high level, and the discharge transistor 102 is turned on. The electrostatic charge is discharged to the ground pad VSS through the second controllable voltage division unit 103-2, the first controllable voltage division unit 103-1, and the discharge transistor 102.

If being in the voltage division mode, the first controllable voltage division unit 103-1 and/or the second controllable voltage division unit 103-2 can carry a part of the voltage applied by the electrostatic charge to the discharge transistor 102. The carried voltage is determined according to a capability of voltage division of the first controllable voltage division unit 103-1. The capability of voltage division of the first controllable voltage division unit 103-1 and the second controllable voltage division unit 103-2 can be adjusted by setting the number of voltage division elements in the first controllable voltage division unit 103-1 and the second controllable voltage division unit 103-2.

Referring to FIG. 4, what is different from FIG. 3 is that: when the discharge transistor 102 is a P-type transistor, the source of the discharge transistor 102 is connected to the power supply pad VDD, the drain of the discharge transistor 102 is connected to the first terminal of the first controllable voltage division unit 103-1, the second terminal of the first controllable voltage division unit 103-1 is connected to the first terminal of the second controllable voltage division unit 103-2, and the second terminal of the second controllable voltage division unit 103-2 is connected to the ground pad VSS.

The monitoring unit 101 includes a monitoring resistor R1 and a monitoring capacitor C1, each provided with a first terminal and a second terminal. The monitoring resistor R1 is provided with the first terminal connected to the power supply pad VDD, and the second terminal successively connected to the first terminal of the monitoring capacitor C1 and the control terminal of the discharge transistor 102. The second terminal of the monitoring capacitor C1 is connected to the ground pad VSS.

When there is an electrostatic charge on the power supply pad VDD, an equivalent resistance of the monitoring capacitor C1 decreases, the control terminal of the discharge transistor 102 is pulled down to a low level, and the discharge transistor 102 is turned on. The electrostatic charge is discharged to the ground pad VSS through the discharge transistor 102, the first controllable voltage division unit 103-1, and the second controllable voltage division unit 103-2.

Figure 5:
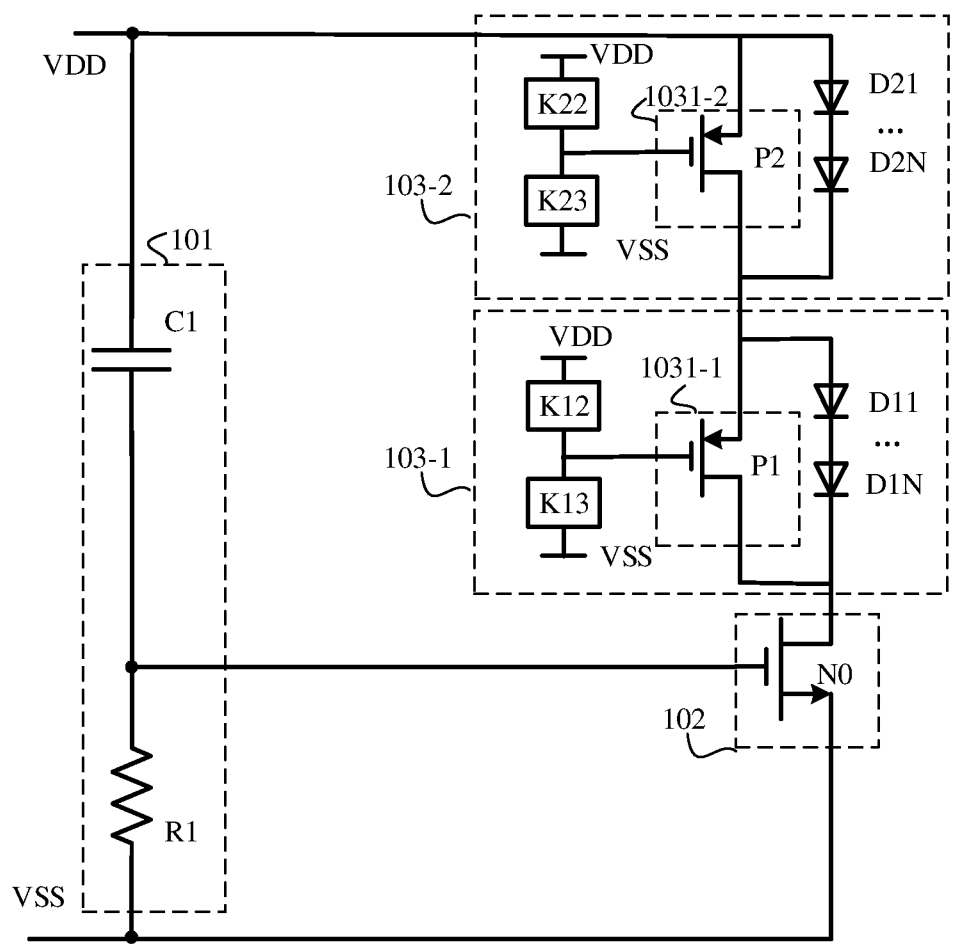
FIG. 5 is a specific circuit diagram of an ESD protection circuit for a chip according to another embodiment of the present disclosure.
Figure 6:
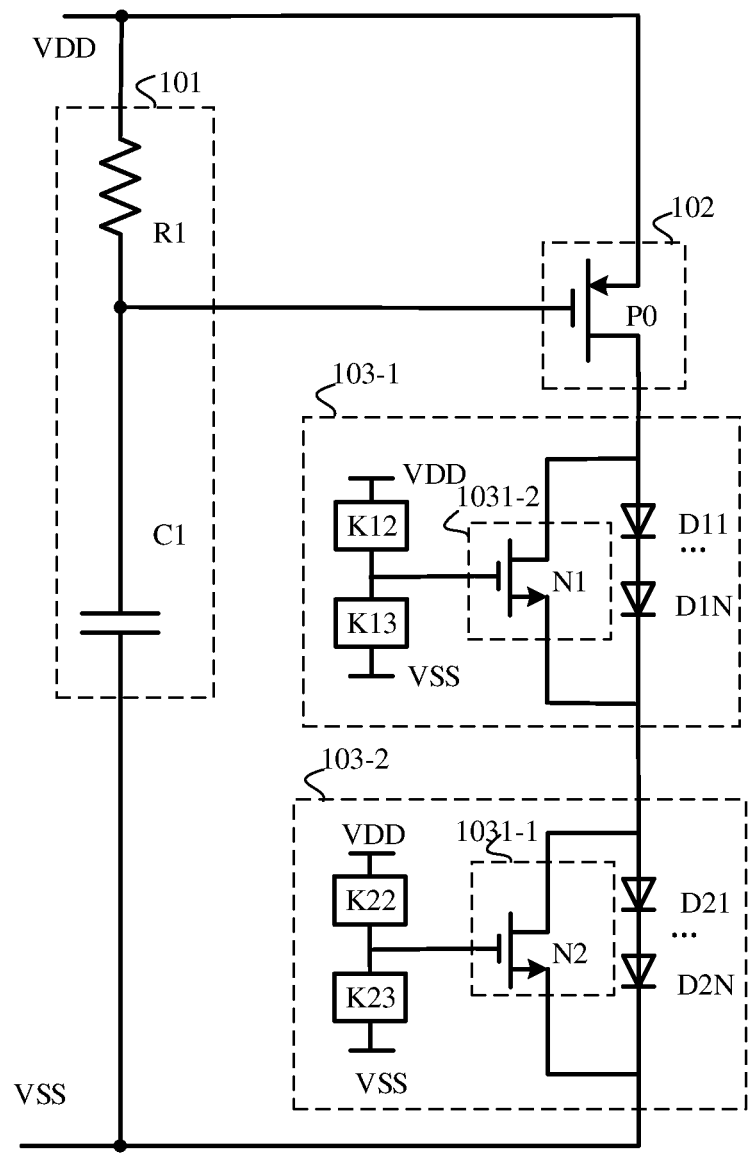
FIG. 6 is a specific circuit diagram of an ESD protection circuit for a chip according to another embodiment of the present disclosure.

In one embodiment, referring to FIG. 5 and FIG. 6, the control circuit includes a control transistor 1031-1, a second switch K12, and a third switch K13. The control transistor 1031-1 is provided with a first terminal connected to the first terminal of the voltage division element at the head end, a second terminal connected to the first terminal of the discharge transistor, and a control terminal. The second switch K12 is provided with a first terminal connected to the power supply pad VDD and a second terminal connected to the control terminal of the control transistor 1031-1. The third switch K13 is also provided with a first terminal connected to the control terminal of the control transistor 1031-1 and a second terminal connected to the ground pad VSS.

Switching the state of the second switch K12 and the state of the third switch K13 through the control signal can switch the control transistor 1031-1 from the on state to the off state or from the off state to the on state. When being switched to the on state, the control transistor 1031-1 makes the voltage division elements connected successively in the bypass state, and the electrostatic current flows through the control transistor 1031-1. When the control transistor 1031-1 is switched to the off state, the electrostatic current flows through the voltage division elements connected successively, and the voltage division elements connected successively in the first controllable voltage division unit 103-1 can perform voltage division on the electrostatic voltage with the discharge transistor 102.

In one embodiment, each of the second switch K12 and the third switch K13 includes a one-time programmable memory. The one-time programmable memory may be a laser fuse device. The state of the second switch K12 and the state of the third switch K13 can be switched by performing laser fuse processing on the corresponding switches.

In some embodiments, the control signal, the switch, etc. are relatively broad concepts. For example, when the second switch K12 is a laser fuse device, the laser fuse device has two states. When the laser fuse device is not fused, it is equivalent to turning on the switch. When the laser fuse device is fused, it is equivalent to turning off the switch. The operation of causing the laser fuse device to be fused can be regarded as a control signal for the laser fuse device.

Still referring to FIG. 5, when the discharge transistor 102 is an N-type transistor, the connection relationship of the discharge transistor 102 with the first controllable voltage division unit 103-1, the second controllable voltage division unit 103-2, and the monitoring unit 101 is the same as that in FIG. 3. Therefore, the details are not described herein again. The structure and operating process of the monitoring unit 101 are also the same as those in FIG. 3. Therefore, details are not described herein again.

The mode switching process of each controllable voltage division unit is described below by taking the first controllable voltage division unit 103-1 as an example. When the discharge transistor 102 is an N-type transistor, the control transistor 1031-1 is a P-type transistor. When only the second switch K12 is subjected to the fuse processing, the second switch K12 is in the fusing state, the third switch K13 is in the non-fusing state, the control terminal of the control transistor 1031-1 is connected to the ground pad VSS, the control transistor 1031-1 is in the on state, the electrostatic current flows through the control transistor 1031-1, and the first controllable voltage division unit 103-1 is in the bypass mode. When only the third switch K13 is subjected to the fuse processing, the second switch K12 is in the non-fusing state, the third switch K13 is in the fusing state, the control terminal of the control transistor 1031-1 is connected to the power supply pad VDD, the control transistor 1031-1 is in the off state, the current caused by the electrostatic charge flows through the control transistor 1031-1, and the first controllable voltage division unit 103-1 is in the voltage division mode.

Still referring to FIG. 6, when the discharge transistor 102 is a P-type transistor, the connection relationship of the discharge transistor 102 with the first controllable voltage division unit 103-1, the second controllable voltage division unit 103-2, and the monitoring unit 101 is the same as that in FIG. 4. Therefore, the details are not described herein again. The structure and operating process of the monitoring unit 101 are also the same as those in FIG. 4. Therefore, details are not described herein again.

The mode switching process of each controllable voltage division unit is described below by taking the first controllable voltage division unit 103-1 as an example. When the discharge transistor 102 is a P-type transistor, the control transistor 1031-1 is an N-type transistor. When only the second switch K12 is subjected to the fuse processing, the second switch K12 is in the fusing state, the third switch K13 is in the non-fusing state, the control terminal of the control transistor 1031-1 is connected to the ground pad VSS, the control transistor 1031-1 is in the off state, the electrostatic current flows through the diodes, and the first controllable voltage division unit 103-1 is in the voltage division mode. When only the third switch K13 is subjected to the fuse processing, the second switch K12 is in the non-fusing state, the third switch K13 is in the fusing state, the control terminal of the control transistor 1031-1 is connected to the power supply pad VDD, the control transistor 1031-1 is in the on state, the electrostatic current flows through the control transistor 1031-1, and the first controllable voltage division unit 103-1 is in the bypass mode.

A plurality of chips are produced through one tape-out, the fuse processing is performed on the laser fuse device in the ESD protection circuit, the number of controllable voltage division units in the voltage division mode in the ESD protection circuit can be set, and the grade of the electrostatic charge that the ESD protection circuit can withstand is set.

As shown in FIG. 7 to FIG. 10, one embodiment of the present disclosure provides an ESD protection circuit for a chip. The ESD protection circuit includes a monitoring unit 101, a drive unit 104, a discharge transistor 102, a first controllable voltage division unit 103-1, and a second controllable voltage division unit 103-2.

The monitoring unit 101 is connected to a control terminal of the discharge transistor 102 through the drive unit 104. With referring to FIG. 7 and FIG. 9, when the discharge transistor 102 is an N-type transistor, the source of the discharge transistor 102 is connected to the ground pad VSS, the drain of the discharge transistor 102 is connected to the second terminal of the first controllable voltage division unit 103-1, the first terminal of the first controllable voltage division unit 103-1 is connected to the second terminal of the second controllable voltage division unit 103-2, and the first terminal of the second controllable voltage division unit 103-2 is connected to the power supply pad VDD.

Figure 7:
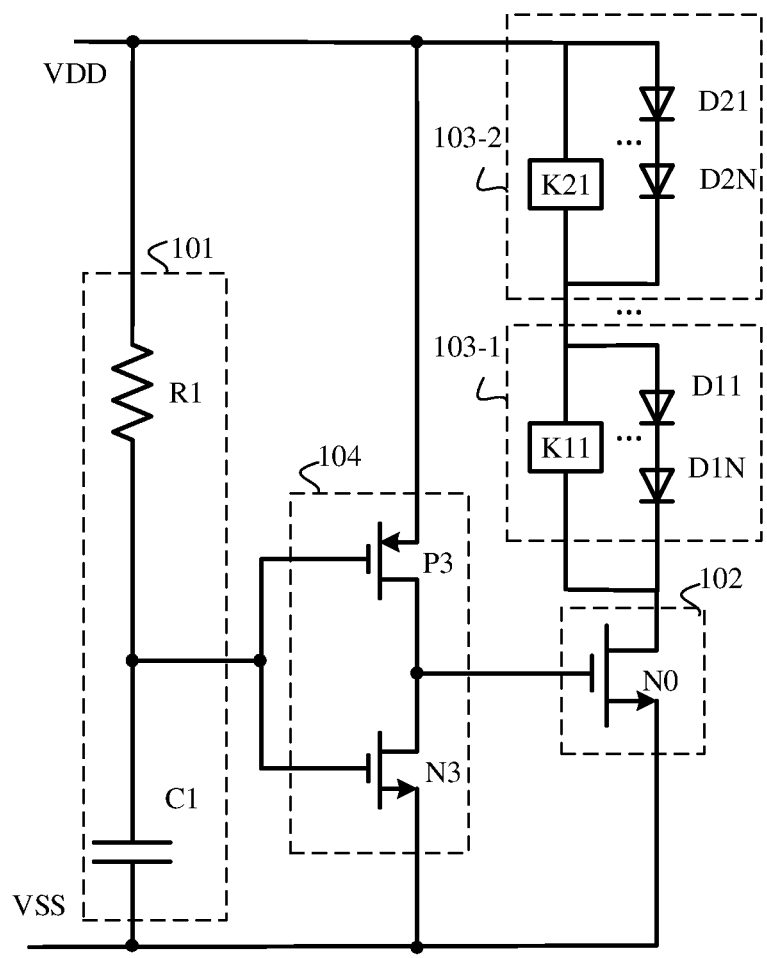
FIG. 7 is a specific circuit diagram of an ESD protection circuit for a chip according to another embodiment of the present disclosure.
Figure 9:
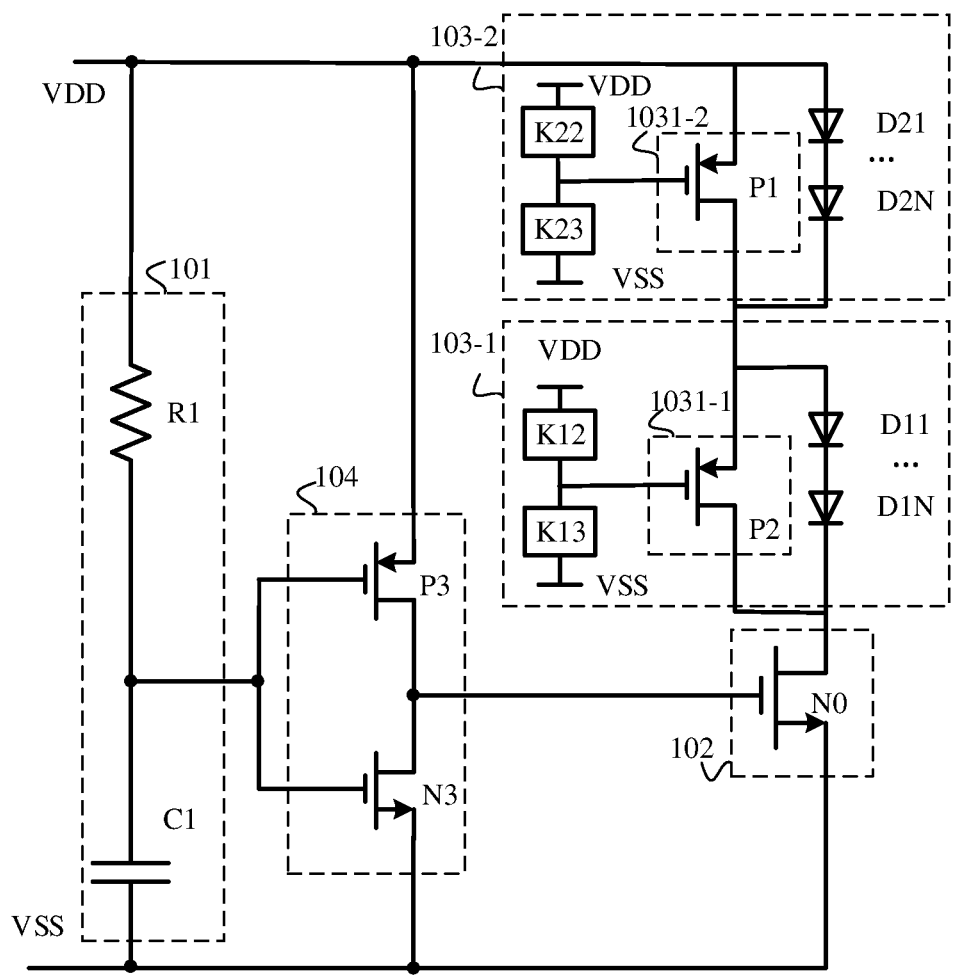
FIG. 9 is a specific circuit diagram of an ESD protection circuit for a chip according to another embodiment of the present disclosure.

Still referring to FIG. 7 and FIG. 9, when the discharge transistor 102 is an N-type transistor, the monitoring unit 101 includes a monitoring resistor R1 and a monitoring capacitor C1, each provided with a first terminal and a second terminal. The monitoring resistor R1 is provided with the first terminal connected to the power supply pad VDD, and the second terminal successively connected to the first terminal of the monitoring capacitor C1 and the control terminal of the discharge transistor 102. The second terminal of the monitoring capacitor C1 is connected to the ground pad VSS.

The drive unit 104 includes a first drive transistor P3 and a second drive transistor N3. The first drive transistor P3 is provided with a first terminal connected to the power supply pad VDD. The second drive transistor N3 is provided with a first terminal successively connected to a second terminal of the first drive transistor P3 and the control terminal of the discharge transistor 102, and a second terminal connected to the ground pad VSS. If the first drive transistor P3 is a P-type transistor, the second drive transistor N3 is an N-type transistor.

When there is an electrostatic charge on the power supply pad VDD, a resistance of the monitoring capacitor C1 decreases, a control terminal of the first drive transistor P3 is pulled down to a low level, a drain of the first drive transistor P3 is pulled up to a high level, the control terminal of the discharge transistor 102 is pulled up to a high level, and the discharge transistor 102 is turned on. The electrostatic charge is discharged to the ground pad VSS through the discharge transistor 102, the first controllable voltage division unit 103-1, and the second controllable voltage division unit 103-2.

Figure 8:
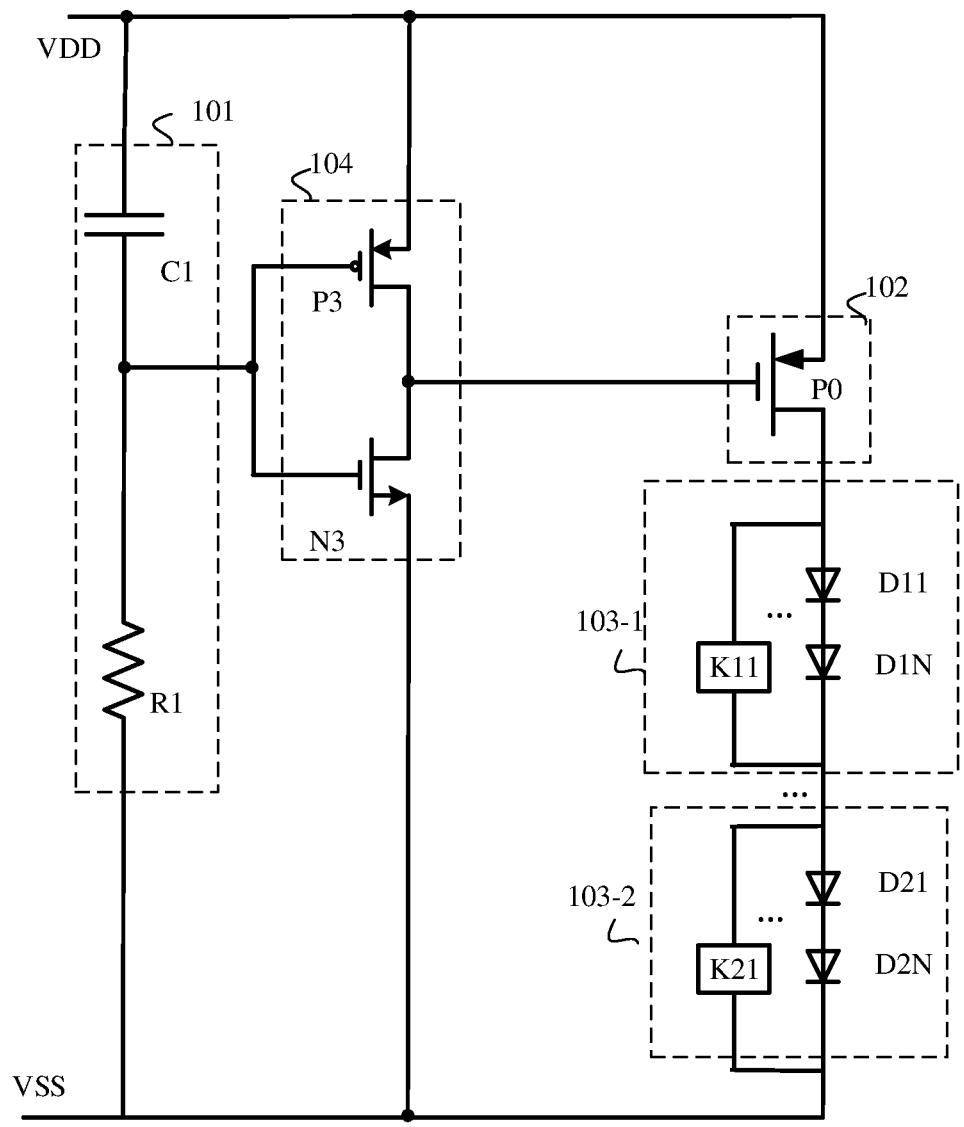
FIG. 8 is a specific circuit diagram of an ESD protection circuit for a chip according to another embodiment of the present disclosure.
Figure 10:
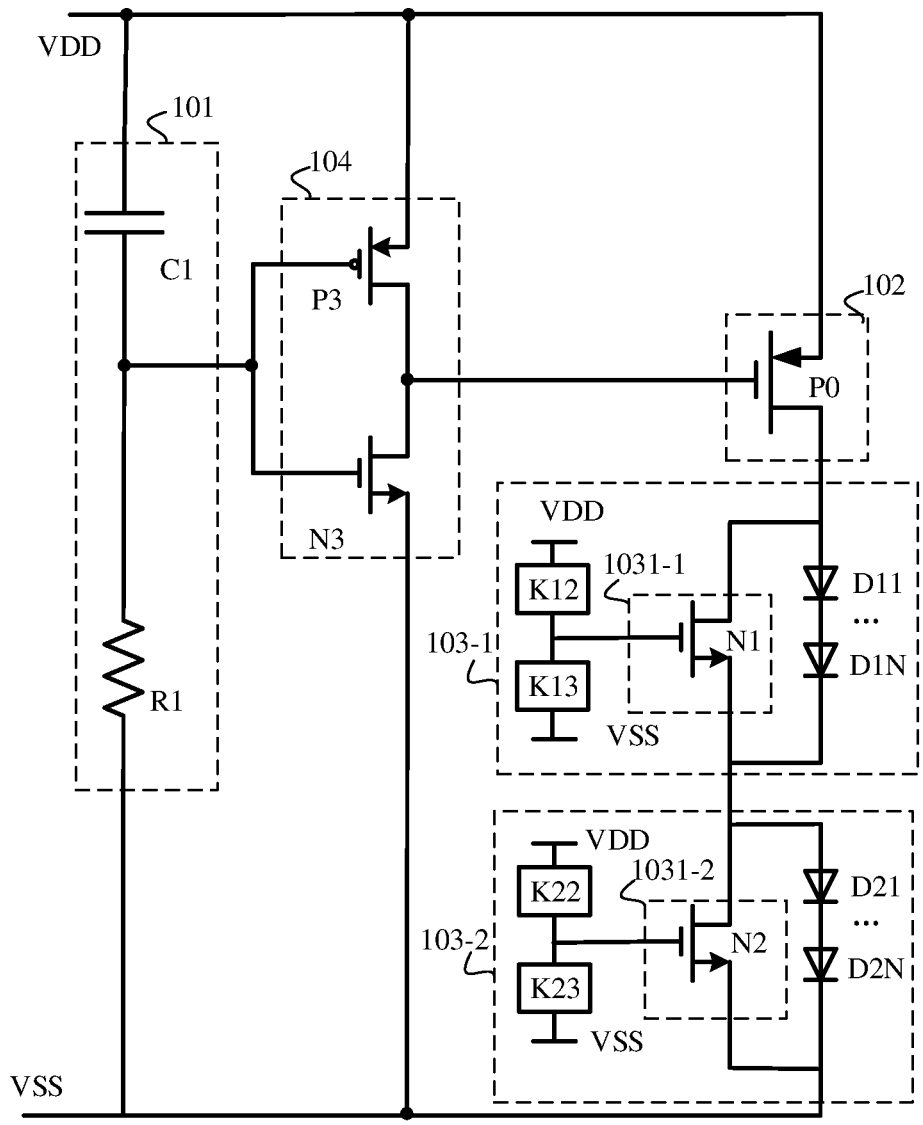
FIG. 10 is a specific circuit diagram of an ESD protection circuit for a chip according to another embodiment of the present disclosure.

Referring to FIG. 8 and FIG. 10, when the discharge transistor 102 is a P-type transistor, the source of the discharge transistor 102 is connected to the power supply pad VDD, the drain of the discharge transistor 102 is connected to the first terminal of the first controllable voltage division unit 103-1, the second terminal of the first controllable voltage division unit 103-1 is connected to the first terminal of the second controllable voltage division unit 103-2, and the second terminal of the second controllable voltage division unit 103-2 is connected to the ground pad VSS.

Still referring to FIG. 8 and FIG. 10, the monitoring unit 101 includes a monitoring capacitor C1 and a monitoring resistor R1, each provided with a first terminal and a second terminal. The monitoring capacitor C1 is provided with the first terminal connected to the power supply pad VDD, and the second terminal successively connected to the first terminal of the monitoring resistor R1 and the control terminal of the discharge transistor 102. The second terminal of the monitoring resistor R1 is connected to the ground pad VSS.

The structure of the drive unit 104 is the same as that in FIG. 7 and FIG. 9. Therefore, details are not described herein again.

When there is an electrostatic charge on the power supply pad VDD, a resistance of the monitoring capacitor C1 decreases, a control terminal of the second drive transistor N3 is pulled up to a high level, a drain of the second drive transistor N3 is pulled down to a low level, the control terminal of the discharge transistor 102 is pulled down to a low level, and the discharge transistor 102 is turned on. The electrostatic charge is discharged to the ground pad VSS through the second controllable voltage division unit 103-2, the first controllable voltage division unit 103-1, and the discharge transistor 102.

The structure of the first controllable voltage division unit 103-1 and the structure of the second controllable voltage division unit 103-2 in FIG. 7 and FIG. 8 are the same as those in FIG. 3 and FIG. 4, and accordingly, the mode switching modes are also the same. Therefore, details are not described herein again. The structure of the first controllable voltage division unit 103-1 and the structure of the second controllable voltage division unit 103-2 in FIG. 9 and FIG. 10 are the same as those in FIG. 5 and FIG. 6, and accordingly, the mode switching modes are also the same. Therefore, details are not described herein again.

In the foregoing technical solution, by adding the drive unit 104 to the ESD protection circuit, the turn-on rate of the discharge transistor 102 can be accelerated, thereby increasing the discharge rate of the discharge transistor 102, and improving the discharge capability of the ESD protection circuit.

It should be noted that the present disclosure is not limited to the precise structures described above and shown in the accompanying drawings, and can be modified and changed in many ways without departing from the scope of the present disclosure. The scope of the present disclosure is defined by the appended claims.

The invention claimed is:

1. An electrostatic discharge protection circuit for a chip, wherein the chip comprises a power supply pad and a ground pad; and the electrostatic discharge protection circuit comprises:

a monitoring unit, configured to generate a trigger signal when there is an electrostatic discharge pulse on the power supply pad;

a discharge transistor, located between the power supply pad and the ground pad, and configured to be turned on under a control of the trigger signal, so as to discharge an electrostatic charge to the ground pad; and a first controllable voltage division unit, connected to the discharge transistor, and configured to switch an operating mode under a control of a control signal, wherein the operating mode comprises a voltage division mode, and when operating in the voltage division mode, the first controllable voltage division unit is configured to carry a part of a voltage applied by the electrostatic charge to the discharge transistor; and, wherein the electrostatic discharge protection circuit further comprises:

a second controllable voltage division unit, connected to the first controllable voltage division unit, and configured to switch an operating mode under the control of the control signal, wherein the operating mode comprises a voltage division mode.

2. The circuit according to claim 1, wherein when the discharge transistor is a P-type transistor, a source of the discharge transistor is connected to the power supply pad, and a drain of the discharge transistor is connected to a first terminal of the first controllable voltage division unit; and a second terminal of the first controllable voltage division unit is connected to a first terminal of the second controllable voltage division unit, and a second terminal of the second controllable voltage division unit is connected to the ground pad.

3. The circuit according to claim 1, wherein when the discharge transistor is an N-type transistor, a source of the discharge transistor is connected to the ground pad, and a drain of the discharge transistor is connected to a second terminal of the first controllable voltage division unit; and a first terminal of the first controllable voltage division unit is connected to a second terminal of the second controllable voltage division unit, and a first terminal of the second controllable voltage division unit is connected to the power supply pad.

4. The circuit according to claim 1, wherein the first controllable voltage division unit comprises:

at least one voltage division element, and the voltage division element being provided with a first terminal and a second terminal, wherein after a successive connection, the first terminal of a voltage division element at a head end is a first terminal of the first controllable voltage division unit, and the second terminal of a voltage division element at a tail end is a second terminal of the first controllable voltage division unit; and a control circuit, connected to the first terminal of the voltage division element at the head end, also connected to the second terminal of the voltage division element at the tail end, and configured to switch the at least one voltage division element from the voltage division mode to a bypass mode or from the bypass mode to the voltage division mode under the control of the control signal.

5. The circuit according to claim 4, wherein the control circuit comprises:

a first switch, provided with a first terminal connected to the first terminal of the voltage division element at the head end and a second terminal connected to the second terminal of the voltage division element at the tail end.

6. The circuit according to claim 5, wherein the first switch, a second switch of the control circuit and a third switch of the control circuit are one-time programmable memories.

7. The circuit according to claim 6, wherein the first switch, the second switch and the third switch are laser fuse devices.

8. The circuit according to claim 7, wherein when a control transistor of the control circuit is a P-type transistor, the second switch is in a fusing state, and the third switch is in a non-fusing state, the first controllable voltage division unit is in the bypass mode; and when the control transistor is a P-type transistor, the second switch is in a non-fusing state, and the third switch is in a fusing state, the first controllable voltage division unit is in the voltage division mode.

9. The circuit according to claim 7, wherein when a control transistor of the control circuit is an N-type transistor, the second switch is in a fusing state, and the third switch is in a non-fusing state, the first controllable voltage division unit is in the voltage division mode; and when the control transistor is an N-type transistor, the second switch is in a non-fusing state, and the third switch is in a fusing state, the first controllable voltage division unit is in the bypass mode.

10. The circuit according to claim 7, wherein when the first switch is in a non-fusing state, the first controllable voltage division unit is in the bypass mode; and when the first switch is in a fusing state, the first controllable voltage division unit is in the voltage division mode.

11. The circuit according to claim 4, wherein the control circuit further comprises:

a control transistor, provided with a first terminal connected to the first terminal of the voltage division element at the head end, a second terminal connected to the second terminal of the voltage division element at the tail end, and a control terminal;

a second switch, provided with a first terminal connected to the power supply pad and a second terminal connected to the control terminal of the control transistor; and a third switch, provided with a first terminal connected to the control terminal of the control transistor and a second terminal connected to the ground pad.

12. The circuit according to claim 4, wherein the voltage division element comprises:

a diode, provided with an anode being the first terminal of the voltage division element and a cathode being the second terminal of the voltage division element.

13. The circuit according to claim 1, wherein a control terminal of the discharge transistor is connected to the monitoring unit.

14. The circuit according to claim 1, further comprising a drive unit, wherein a control terminal of the discharge transistor is connected to the monitoring unit through the drive unit.

\* \* \* \* \*